(12) United States Patent
Shrivastava et al.

(10) Patent No.: US 10,319,662 B2
(45) Date of Patent: Jun. 11, 2019

(54) NON-PLANAR ELECTROSTATIC DISCHARGE (ESD) PROTECTION DEVICES WITH NANO HEAT SINKS

(71) Applicant: INDIAN INSTITUTE OF SCIENCE, Bangalore, Karnataka (IN)

(72) Inventors: Mayank Shrivastava, Bangalore (IN); Milova Paul, Bangalore (IN); Christian Russ, Diedorf (DE); Harald Gossner, Riemerling (DE)

(73) Assignee: INDIAN INSTITUTE OF SCIENCE, Bangalore (IN)

( * ) Notice: Subject to any disclaimer, the term of this patent is extended or adjusted under 35 U.S.C. 154(b) by 0 days.

(21) Appl. No.: 15/883,749

(22) Filed: Jan. 30, 2018

(65) Prior Publication Data

US 2018/0226317 A1 Aug. 9, 2018

(30) Foreign Application Priority Data

Feb. 1, 2017 (IN) .............................. 201741003773

(51) Int. Cl.
| | |
|---|---|
| *H01L 23/367* | (2006.01) |
| *H01L 27/088* | (2006.01) |
| *H01L 29/423* | (2006.01) |
| *H01L 29/74* | (2006.01) |
| *H01L 29/861* | (2006.01) |
| *H01L 29/06* | (2006.01) |

(Continued)

(52) U.S. Cl.
CPC ........ *H01L 23/367* (2013.01); *H01L 27/0248* (2013.01); *H01L 27/0886* (2013.01); *H01L 29/0649* (2013.01); *H01L 29/42356* (2013.01); *H01L 29/7436* (2013.01); *H01L 29/861* (2013.01); *H01L 29/8613* (2013.01); *H01L 29/0657* (2013.01); *H01L 29/735* (2013.01)

(58) Field of Classification Search
CPC .............. H01L 23/367; H01L 27/0248; H01L 27/0886; H01L 29/0649; H01L 29/42356; H01L 29/735; H01L 29/7436; H01L 29/861; H01L 29/8613; H01L 29/0657
See application file for complete search history.

(56) References Cited

U.S. PATENT DOCUMENTS

| | | |
|---|---|---|
| 6,909,149 B2 | 6/2005 | Russ et al. |
| 7,135,745 B1 | 11/2006 | Horch et al. |

(Continued)

*Primary Examiner* — Sitaramarao S Yechuri
(74) *Attorney, Agent, or Firm* — Oliff PLC

(57) ABSTRACT

The present disclosure relates to a thermal management solution for ESD protection devices in advanced Fin- and/or Nanowire-based technology nodes, by employing localized nano heat sinks, which enable heat transport from local hot spots to surface of chip, which allows significant reduction in peak temperature for a given ESD current. In an aspect, the proposed semiconductor device can include at least one fin having a source and a drain disposed over a p-well or a n-well in a substrate; an electrically floating dummy metal gate disposed close to drain or hot spot over at least a portion of the at least one fin, and an electrical metal gate is disposed close to the source; and a nano-heat sink operatively coupled with the dummy metal gate and terminating at the surface of chip in which the semiconductor device is configured so as to enable transfer of heat received from the at least one fin through the dummy metal gate to the surface of the chip.

23 Claims, 12 Drawing Sheets

(51) Int. Cl.
*H01L 27/02* (2006.01)
*H01L 29/735* (2006.01)

(56) References Cited

U.S. PATENT DOCUMENTS

| | | | |
|---|---|---|---|
| 7,166,876 B2 | 1/2007 | Huang | |
| 7,560,784 B2 | 7/2009 | Cheng et al. | |
| 7,638,370 B2 | 12/2009 | Gossner et al. | |
| 7,888,775 B2 | 2/2011 | Russ et al. | |
| 7,964,893 B2 | 6/2011 | Lee | |
| 8,927,397 B2 | 1/2015 | Chang et al. | |
| 8,928,083 B2 | 1/2015 | Chang et al. | |
| 8,941,161 B2 | 1/2015 | Basker et al. | |
| 8,963,201 B2 | 2/2015 | Shrivastava et al. | |
| 9,006,054 B2 | 4/2015 | Cheng et al. | |
| 9,177,951 B2 | 11/2015 | Singh et al. | |
| 9,214,540 B2 | 12/2015 | Tsai et al. | |
| 9,236,374 B2 | 1/2016 | Campi, Jr. et al. | |
| 9,240,471 B2 | 1/2016 | Di Sarro et al. | |
| 9,318,622 B1 | 4/2016 | Logan et al. | |
| 9,368,629 B2 | 6/2016 | Tsai et al. | |
| 9,391,060 B2 | 7/2016 | Hellings et al. | |
| 2004/0207021 A1 | 10/2004 | Russ et al. | |
| 2005/0212051 A1 | 9/2005 | Jozwiak et al. | |
| 2006/0063334 A1 | 3/2006 | Donze et al. | |
| 2007/0040221 A1 | 2/2007 | Gossner et al. | |
| 2007/0262386 A1 | 11/2007 | Gossner et al. | |
| 2007/0267700 A1* | 11/2007 | Russ | H01L 27/0255 257/355 |
| 2009/0206367 A1 | 8/2009 | Gauthier, Jr. et al. | |
| 2010/0187656 A1 | 7/2010 | Ke et al. | |
| 2010/0207161 A1 | 8/2010 | Shrivastava et al. | |
| 2012/0049282 A1 | 3/2012 | Chen et al. | |
| 2013/0157425 A1* | 6/2013 | Morimoto | H01L 21/823828 438/218 |
| 2013/0168732 A1 | 7/2013 | Lin et al. | |
| 2013/0168771 A1 | 7/2013 | Wu et al. | |
| 2013/0175578 A1 | 7/2013 | Lee et al. | |
| 2013/0292745 A1 | 11/2013 | Liu et al. | |
| 2014/0097465 A1 | 4/2014 | Shrivastava et al. | |
| 2014/0131765 A1 | 5/2014 | Tsai et al. | |
| 2014/0141586 A1* | 5/2014 | Hu | H01L 21/823481 438/290 |
| 2014/0183641 A1 | 7/2014 | Fan et al. | |
| 2014/0191319 A1 | 7/2014 | Cheng et al. | |
| 2014/0217502 A1 | 8/2014 | Chang et al. | |
| 2014/0252476 A1 | 9/2014 | Chang et al. | |
| 2015/0014785 A1* | 1/2015 | Chung | G11C 17/18 257/379 |
| 2015/0014809 A1 | 1/2015 | Wang et al. | |
| 2015/0091090 A1 | 4/2015 | Okuno et al. | |
| 2015/0137255 A1 | 5/2015 | Wen et al. | |
| 2015/0145592 A1 | 5/2015 | Li et al. | |
| 2015/0311342 A1 | 10/2015 | Lin et al. | |
| 2016/0020203 A1 | 1/2016 | Zhang et al. | |
| 2016/0064371 A1 | 3/2016 | Lee et al. | |
| 2016/0254382 A1* | 9/2016 | Hoentschel | H01L 29/7851 257/401 |

* cited by examiner

NON-PLANAR ELECTROSTATIC DISCHARGE (ESD) PROTECTION DEVICES WITH NANO HEAT SINKS

TECHNICAL FIELD

The present disclosure relates to the field of ESD protection devices. In particular, the present disclosure pertains to a non-planar electrostatic discharge (ESD) protection device with nano heat sink(s).

BACKGROUND

Background description includes information that may be useful in understanding the present invention. It is not an admission that any of the information provided herein is prior art or relevant to the presently claimed invention, or that any publication specifically or implicitly referenced is prior art.

Transistors and other circuits fabricated in semiconductor substrates are continually being reduced in size as semiconductor fabrication technology advances. Such circuits are also increasingly susceptible to damage from ESD events, thus increasing the importance of the ESD protection implemented in integrated circuits.

Typical ESD protection circuits include diodes that are connected between integrated circuit pin connections and power/ground connections. The diodes are designed to turn on if an ESD event occurs, rapidly discharging the ESD event to avoid damage to the functional circuits (e.g. driver/ receiver transistors) that are coupled to the connections.

There are many prior-art documents that provide different ways of designing non-planar ESD diodes. For example, US Patent documents U.S. Pat. No. 8,928,083B2. US2016/ 0020203A1, U.S. Pat. No. 7,560,784B2, US2014/ 0191319A1, US2006/0063334A1, U.S. Pat. No. 7,964, 893B2, US2014/0183641A1, U.S. Pat. No. 9,006,054B2, US2014/0252476A1, U.S. Pat. No. 8,941,161B2, U.S. Pat. No. 9,177,951B2, U.S. Pat. No. 8,927,397B2, US2014/ 0217502A1, U.S. Pat. No. 9,368,629B2, US2014/ 0131765A1, U.S. Pat. No. 9,391,060B2, US2015/ 0014809A1, U.S. Pat. No. 9,318,622B1, US2013/ 0292745A1, US2015/0091090A1, and U.S. Pat. No. 7,888, 775B2 provide various designs of diode FinFET (non-planar ESD diodes), however, due to the in efficacy of heat dissipation mechanisms and much higher packing density of active area (Fins/Nanowires), these designs exhibit an increased self-heating over the device active area, which leads to an early failure.

There are many prior-art documents that provide ways of implementing BJT and SCR-like devices in FinFET technologies such as but not limited to BJT/ggNMOS FinFET, SCR devices in FinFET and bulk FinFET technology, SCR devices with N and P trigger taps for injecting a trigger current (for tuning trigger/holding voltage) in planar SOI technology, and SCR devices with N and P taps (terminals labeled with N-body and P-body) in a different scheme in order to control holding/trigger voltage in planar SOI technology. For example, US Patent documents US2010/ 0187656A1, US2015/0145592A1, US2007/0262386A1, US2007/0040221A1, US2015/0311342A1, US2012/ 0049282A1, US2013/0168732A1, US2013/0175578A1, US2013/0168771A1, U.S. Pat. No. 7,166,876B2, U.S. Pat. No. 9,214,540B2, US2016/0064371A1, US2015/ 0137255A1, US2004/0207021A1, U.S. Pat. No. 6,909, 149B2, US2005/0212051A1, US2009/0206367A1, U.S. Pat. No. 7,638,370B2, and US2010/0207161A1, U.S. Pat. No. 9,240,471B2, U.S. Pat. No. 9,236,374B2, U.S. Pat. No. 7,135,745B1, U.S. Pat. No. 8,963,201B2, and US2014/ 0097465A1 provide ways of implementing BJT and SCR-like devices in FinFET technologies. However, solutions provided in these prior-arts too suffer from high packing density and enhanced self-heating.

Although the advent of non-planar technologies has paved new and efficient ways to replace their planar counterparts by offering beneficial technological solutions to scale conventional transistors, this has come with a price of lowered ESD robustness and high power density in these advanced technology nodes. ESD is a random event that leads to massive flow of current (in amperes) between bodies having different electrostatic potential for sub-500 ns duration. Power density (or volume power density or volume specific power) is the amount of power (time rate of energy transfer) per unit volume. In energy transformers including batteries, fuel cells, motors, etc., and also power supply units or similar, power density refers to a volume. Power density and therefore self-heating across non-planar devices like FinFETs and Nanowire FETs during Electrostatic Discharge (ESD) events is significantly higher compared to their planar counter parts. Such power density and therefore self-heating during ESD events has attributed to various limitations and drawbacks such as, but not limited to higher packing density of non-planar devices, increased active device width/current per unit area, and reduced substrate area available for heat conduction, which leads to early failure and seriously lowered performance of ESD protection devices in non-planar technologies.

Further, it is also observed that most of the existing and currently available prior-arts are centered on carrier transport under ESD conditions, triggering voltage, holding voltage, etc; however none of such known arts have proposed a solution to improve failure current by employing any heat transport mechanism.

There is therefore a need in the art for a solution to reduce self-heating across ESD protection devices in non-planar technologies by employing efficient heat dissipation mechanisms which further leads to improvement in failure current, thereby enhancing product reliability and life expectancy. There is also a need to provide a solution to reduce self-heating across ESD protection devices in non-planar technologies, thereby eventually saving ESD protection area for a given robustness level resulting in lowered chip cost.

All publications herein are incorporated by reference to the same extent as if each individual publication or patent application were specifically and individually indicated to be incorporated by reference. Where a definition or use of a term in an incorporated reference is inconsistent or contrary to the definition of that term provided herein, the definition of that term provided herein applies and the definition of that term in the reference does not apply.

In some embodiments, numerical parameters set forth in the written description and attached claims are approximations that can vary depending upon the desired properties sought to be obtained by a particular embodiment. In some embodiments, the numerical parameters should be construed in light of the number of reported significant digits and by applying ordinary rounding techniques. Notwithstanding that the numerical ranges and parameters setting forth the broad scope of some embodiments of the invention are approximations, the numerical values set forth in the specific examples are reported as precisely as practicable. The numerical values presented in some embodiments of the invention may contain certain errors necessarily resulting from the standard deviation found in their respective testing measurements.

As used in the description herein and throughout the claims that follow, the meaning of "a," "an," and "the" includes plural reference unless the context clearly dictates otherwise. Also, as used in the description herein, the meaning of "in" includes "in" and "on" unless the context clearly dictates otherwise.

The recitation of ranges of values herein is merely intended to serve as a shorthand method of referring individually to each separate value falling within the range. Unless otherwise indicated herein, each individual value is incorporated into the specification as if it were individually recited herein. All methods described herein can be performed in any suitable order unless otherwise indicated herein or otherwise clearly contradicted by context. The use of any and all examples, or exemplary language (e.g. "such as") provided with respect to certain embodiments herein is intended merely to better illuminate the invention and does not pose a limitation on the scope of the invention otherwise claimed. No language in the specification should be construed as indicating any non-claimed element essential to the practice of the invention.

Groupings of alternative elements or embodiments of the invention disclosed herein are not to be construed as limitations. Each group member can be referred to and claimed individually or in any combination with other members of the group or other elements found herein. One or more members of a group can be included in, or deleted from, a group for reasons of convenience and/or patentability. When any such inclusion or deletion occurs, the specification is herein deemed to contain the group as modified thus fulfilling the written description used in the appended claims.

OBJECTS OF THE INVENTION

It is an object of the present disclosure to propose a semiconductor device that reduces self-heating across ESD protection devices in non-planar technologies.

It is an object of the present disclosure to propose a semiconductor device that improves failure current.

It is an object of the present disclosure to propose a semiconductor device that enhances product reliability and life expectancy.

It is an object of the present disclosure to propose a semiconductor device that saves ESD protection area for a given robustness level resulting in lowered chip cost.

It is an object of the present disclosure to provide a thermal management solution for non-planar technologies that can be configured in semiconductor devices.

SUMMARY

The present disclosure is provided to solve technical problems of existing prior art existed, wherein an exemplary technical problem solved by the proposed system/architecture/solution relates to the issue of self-heating across ESD protection devices in non-planar technologies. Specifically, the present disclosure solves the issue of high power density and therefore self-heating across non-planar devices like FinFETs and Nanowire FETs during Electrostatic Discharge (ESD) events that are caused by various critical issues, such as but not limited to, higher packing density of non-planar devices, increased active device width/current per unit area and reduced substrate area available for heat conduction. In context of ESD, these issues lead to an early failure and seriously lowered performance of ESD protection devices in non-planar technologies.

In response to these problems, the present disclosure provides a solution to reduce self-heating across ESD protection devices in non-planar technologies. From ESD robustness point of view, the solution according to the present disclosure offers 50% improvement in failure current thereby enhances the product reliability and life expectancy. This eventually can save 50% ESD protection area for a given robustness level, thereby lowers the chip cost by at least 10%.

In an aspect, solution provided according to an aspect of the present disclosure relates to use of dummy gate(s) next to hot spot(s) in place of implant blocking layer(s)/diffusion isolation layer(s), providing an electrical coupling using metal (and hence thermal coupling) to the dummy gate(s) that are configured next to hot spot(s), and deploying a localized nano-heat sink over a region wherein the metal coupling a group of the dummy gate(s) terminates, which leverages heat transported from local hot spots, through dummy gate and the metal coupling them, to the surface of the chip.

In an aspect, the present disclosure relates to a semiconductor device comprising at least one fin; a dummy metal gate disposed over at least a portion of the at least one fin; and a nano-heat sink operatively coupled with the dummy metal gate and terminating at the surface of chip in which the semiconductor device is configured so as to enable transfer of heat received from the at least one fin through the dummy metal gate.

In an aspect, the dummy metal gate isolates anode and cathode regions of the at least one fin.

In another aspect, the semiconductor device can include a plurality of dummy metal gates that can be connected to a metal pad at its one first end, and wherein at its second end, the metal pad is connected to the nano-heat sink. In another aspect, the semiconductor device can include a plurality of dummy metal gates that can be connected to a metal pad at its one first end, and wherein at its second end, the metal pad is connected to the nano-heat sink.

In another aspect, the semiconductor device can be a dual-gate FinFET comprising a metal gate that is operatively coupled with the dummy metal gate.

In another aspect, the at least one fin can include n-type cathode and p-type anode disposed over a n-type well, or can include n-type cathode and p-type anode over p-type well that is disposed over p-type substrate.

In an aspect, the semiconductor device can be any or a combination of a SCR FinFET, FinFET diode, ggFinFET, and a FinBJT.

In another aspect, the dummy metal gate can be used as an implant blocking mask over the at least one fin and is used in areas that generate the heat, wherein the dummy metal gate terminates over STI that is adjacent to the at least one fin.

In another aspect, a plurality of dummy metal gates can be configured in the proposed device, wherein each gate of the plurality of dummy metal gates is configured on a fin selected from a plurality of fins that form part of the semiconductor device. In another aspect, a plurality dummy metal gates can be configured on the at least one fin, and wherein region between the plurality dummy metal gates and the electrical gates can be either N+ type, P+ type or intrinsic.

In an aspect, the at least one fin can include an array of fins that are isolated by shallow trench isolation (STI) that extends from p-type anode, via an intrinsic region, to n-type cathode, wherein the dummy metal stack is deposited over intrinsic region of the array of fins and gets terminated over an extended STI at the end of the array and wherein the intrinsic region is any of n-type or p-type doped.

In another exemplary aspect, the at least one fin can include an array of fins that can be isolated by shallow trench isolation (STI) that extends from N-type source, via an intrinsic region, to N-type drain, disposed over a P-type well in a substrate, wherein an electrical gate stack is deposited over the intrinsic region near the source side of the array of fins, and gets terminated over an extended STI at the end of the array, which provides MOSFET operation, and wherein a dummy metal stack is deposited over intrinsic region near the drain side of the array of fins, and gets terminated over an extended STI at the end of the array, and wherein the intrinsic region is any of n-type or p-type doped.

In yet another exemplary aspect, the at least one fin can include an array of fins that can be isolated by shallow trench isolation (STI) that extends from P-type source, via an intrinsic region, to P-type drain disposed over n-type well in a substrate, wherein an electrical gate stack is deposited over the intrinsic region near the source side of the array of fins, and gets terminated over an extended STI at the end of the array, which provides MOSFET operation, and wherein a dummy metal stack can be deposited over intrinsic region near the drain side of the array of fins, and gets terminated over an extended STI at the end of the array, and wherein the intrinsic region is any of n-type or p-type doped.

In another aspect, the at least one fin can include an array of fins that can be isolated by shallow trench isolation (STI) that extends from N-type emitter, via an intrinsic region, to N-type collector, disposed over a p-type well, wherein the N-type emitter is physically isolated from the intrinsic fin region via STI, and wherein the dummy metal stack is deposited over intrinsic region of the array of fins next to the N-type collector, and gets terminated over an extended STI at the end of the array and wherein the intrinsic region is any of n-type or p-type doped.

In yet another aspect, the at least one fin can include an array of fins that are isolated by shallow trench isolation (STI) that extends from P-type emitter, via an intrinsic region, to P-type collector, disposed over n-type well, wherein the P-type emitter is physically isolated from the intrinsic fin region via STI, and wherein the dummy metal stack is deposited over intrinsic region of the array of fins next to the P-type collector, and gets terminated over an extended STI at the end of the array and wherein the intrinsic region is any of n-type or p-type doped.

In another aspect, the at least one fin can include an array of fins that are isolated by shallow trench isolation (STI) that extends from P-type tap, via an n-type cathode and p-type anode, to an N-type tap, wherein the p-type tap and the cathode are isolated by an intrinsic fin region or shallow trench isolation between them and are disposed over a p-type well in a substrate, and wherein the n-type tap and the anode are isolated by an intrinsic Fin region or a shallow trench isolation between them and are disposed over a n-type well in the substrate, wherein the dummy metal stack is deposited over intrinsic region between the anode and the cathode, and gets terminated over an extended STI at the end of the array and wherein the intrinsic region is any of n-type or p-type doped.

In an aspect, 3D structure of the semiconductor device can be repeated in X and Y directions so as to create devices with larger electrical widths. In another aspect, the proposed semiconductor device can include guard-rings. In yet another aspect, the at least one fin of the proposed device can be made of nano wire or an array of nanowires. The at least one fin can further be made of any or a combination of Si, SiGe, and Ge, materials belonging to III-V or III-Nitride groups, transition metal dichalcogenides or other 2-Dimensional semiconductors.

In an aspect, the present disclosure further relates to an integrated circuit made of semiconductor devices as mentioned above.

BRIEF DESCRIPTION OF THE DRAWINGS

The accompanying drawings are included to provide a further understanding of the present disclosure, and are incorporated in and constitute a part of this specification. The drawings illustrate exemplary embodiments of the present disclosure and, together with the description, serve to explain the principles of the present disclosure.

DETAILED DESCRIPTION

Figure 1:
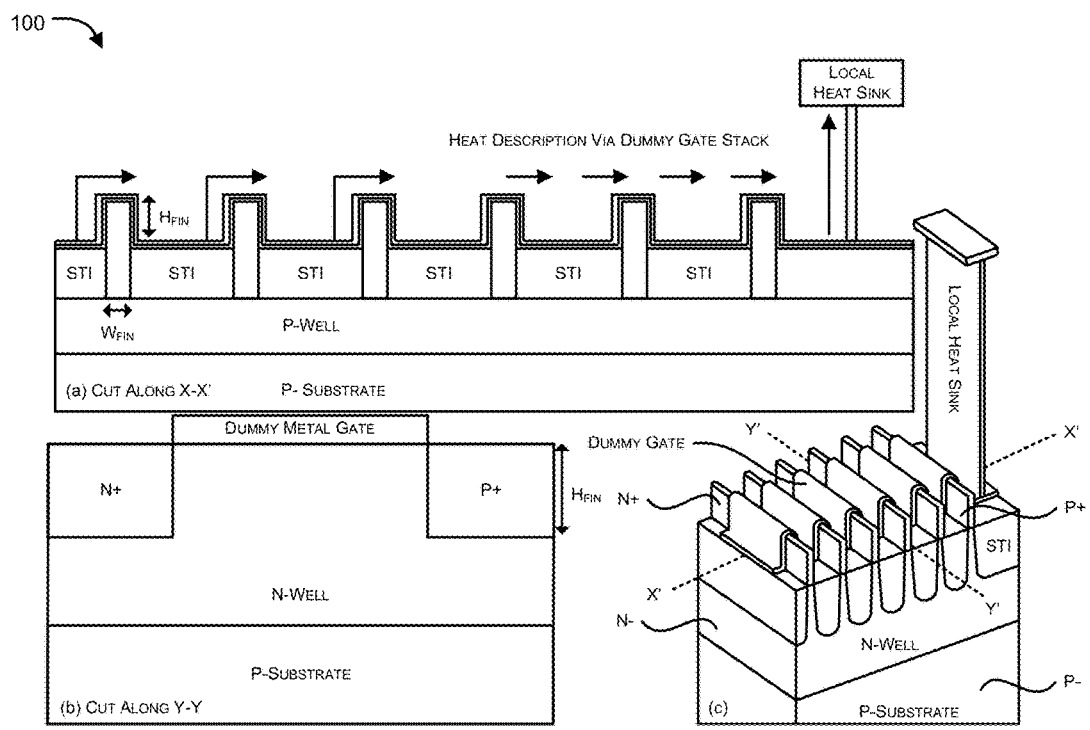
FIG. 1 illustrates exemplary representation of the proposed Nano-heat sink approach implemented for a FinFET diode in accordance with an embodiment of the present disclosure.

The following is a detailed description of embodiments of the disclosure depicted in the accompanying drawings. The embodiments are in such detail as to clearly communicate the disclosure. However, the amount of detail offered is not intended to limit the anticipated variations of embodiments; on the contrary, the intention is to cover all modifications, equivalents, and alternatives falling within the spirit and scope of the present disclosure as defined by the appended claims.

Each of the appended claims defines a separate invention, which for infringement purposes is recognized as including equivalents to the various elements or limitations specified in the claims. Depending on the context, all references below to the "invention" may in some cases refer to certain specific embodiments only. In other cases it will be recognized that references to the "invention" will refer to subject matter recited in one or more, but not necessarily all, of the claims.

Various terms as used herein are shown below. To the extent a term used in a claim is not defined below, it should be given the broadest definition persons in the pertinent art have given that term as reflected in printed publications and issued patents at the time of filing.

The present disclosure is provided to solve technical problems of existing prior art existed, wherein an exemplary technical problem solved by the proposed system/architecture/solution relates to the issue of self-heating across ESD protection devices in non-planar technologies. Specifically, the present disclosure solves the issue of high power density and therefore self-heating across non-planar devices like FinFETs and Nanowire FETs during Electrostatic Discharge (ESD) events that are caused by various critical issues, such as but not limited to, higher packing density of non-planar devices, increased active device width/current per unit area and reduced substrate area available for heat conduction. In context of ESD, these issues lead to an early failure and seriously lowered performance of ESD protection devices in non-planar technologies.

In response to these problems, the present disclosure provides a solution to reduce self-heating across ESD protection devices in non-planar technologies. From ESD robustness point of view, the solution according to the present disclosure offers 50% improvement in failure current thereby enhances the product reliability and life expectancy. This eventually can save 50% ESD protection area for a given robustness level, thereby lowers the chip cost by at least 10%.

In an aspect, solution provided according to an aspect of the present disclosure relates to use of dummy gate(s) next to hot spot(s) in place of implant blocking layer(s)/diffusion isolation layer(s), providing an electrical coupling using metal (and hence thermal coupling) to the dummy gate(s) that are configured next to hot spot(s), and deploying a localized nano-heat sink over a region wherein the metal coupling a group of the dummy gate(s) terminates, which leverages heat transport from local hot spots, through dummy gate and the metal coupling them, to the surface of the chip.

In an aspect, the present disclosure relates to a semiconductor device comprising at least one fin; a dummy metal gate disposed over at least a portion of the at least one fin; and a nano-heat sink operatively coupled with the dummy metal gate and terminating at the surface of chip in which the semiconductor device is configured so as to enable transfer of heat received from the at least one fin through the dummy metal gate.

In an aspect, the dummy metal gate isolates anode and cathode regions of the at least one fin.

In another aspect, the semiconductor device can include a plurality of dummy metal gate that are connected to a metal pad at its one first end, and wherein at its second end, the metal is connected to the nano-heat sink.

In another aspect, the semiconductor device can be a dual-gate FinFET comprising a metal gate that is operatively coupled with the dummy metal gate.

In another aspect, the at least one fin can include n-type cathode and p-type anode disposed over a n-type well, or can include n-type cathode and p-type anode over p-type well that is disposed over p-type substrate.

In an aspect, the semiconductor device can be any or a combination of a SCR FinFET, FinFET diode, ggFinFET, and a FinBJT.

In another aspect, the dummy metal gate can be used as an implant blocking mask over the at least one fin and is used in areas that generate the heat, wherein the dummy metal gate terminates over STI that is adjacent to the at least one fin or a group of fins.

In another aspect, a plurality of dummy metal gates can be configured in the proposed device, each gate being configured on a fin selected from a plurality of fins that form part of the semiconductor device. In another aspect, a plurality dummy metal gates can be configured on the at least one fin, and wherein region between the plurality dummy metal gates and the electrical gates can be either N+ type, P+ type or intrinsic.

In an aspect, the at least one fin can include an array of fins that are isolated by shallow trench isolation (STI) that extends from p-type anode, via an intrinsic region, to n-type cathode, wherein the dummy metal stack is deposited over intrinsic region of the array of fins and gets terminated over an extended STI at the end of the array and wherein the intrinsic region is any of n-type or p-type doped.

In another aspect, the at least one fin can include an array of fins that are isolated by shallow trench isolation (STI) that extends from N-type source, via an intrinsic region, to N-type drain, disposed over a p-type well in a substrate, wherein an electrical gate stack is deposited over the intrinsic region near the source side of the array of fins, and gets terminated over an extended STI at the end of the array, which provides MOSFET operation, and wherein a dummy metal stack is deposited over intrinsic region near the drain side, of the array of fins and gets terminated over an extended STI at the end of the array and wherein the intrinsic region is any of n-type or p-type doped.

In another exemplary aspect, the at least one fin can include an array of fins that can be isolated by shallow trench isolation (STI) that extends from P-type source, via an intrinsic region, to P-type drain, disposed over a N-type well in a substrate, wherein an electrical gate stack is deposited over the intrinsic region near the source side of the array of fins, and gets terminated over an extended STI at the end of the array, which provides MOSFET operation, and wherein a dummy metal stack is deposited over intrinsic region near the drain side of the array of fins, and gets terminated over an extended STI at the end of the array, and wherein the intrinsic region is any of n-type or p-type doped.

In another aspect, the at least one fin can include an array of fins that can be isolated by shallow trench isolation (STI)

that extends from N-type emitter, via an intrinsic region, to N-type collector, disposed over a p-type well, wherein the N-type emitter is physically isolated from the intrinsic fin region via STI, and wherein the dummy metal stack is deposited over intrinsic region of the array of fins next to the N-type collector, and gets terminated over an extended STI at the end of the array and wherein the intrinsic region is any of n-type or p-type doped.

In yet another aspect, the at least one fin can include an array of fins that are isolated by shallow trench isolation (STI) that extends from P-type emitter, via an intrinsic region, to P-type collector, disposed over a n-type well, wherein the P-type emitter is physically isolated from the intrinsic fin region via STI, and wherein the dummy metal stack is deposited over intrinsic region of the array of fins next to the P-type collector, and gets terminated over an extended STI at the end of the array and wherein the intrinsic region is any of n-type or p-type doped.

In another aspect, the at least one fin can include an array of fins that are isolated by shallow trench isolation (STI) that extends from P-type tap, via an n-type cathode and p-type anode, to an N-type tap, wherein the p-type tap and the cathode are isolated by an intrinsic fin region or shallow trench isolation between them and are disposed over a p-type well in a substrate, and wherein the n-type tap and the anode are isolated by an intrinsic Fin region or a shallow trench isolation between them and are disposed over a n-type well in the substrate, wherein the dummy metal stack is deposited over intrinsic region between the anode and the cathode, and gets terminated over an extended STI at the end of the array and wherein the intrinsic region is any of n-type or p-type doped.

In an aspect, 3D structure of the semiconductor device can be repeated in X and Y directions so as to create devices with larger electrical widths. In another aspect, the proposed semiconductor device can include guard-rings. In yet another aspect, the at least one fin of the proposed device can be made of nanowire or an array of nanowires. The at least one fin can further be made of any or a combination of Si, SiGe, and Ge, materials belonging to III-V or III-Nitride groups, transition metal dichalcogenides or other 2-Dimensional semiconductors.

In an aspect, the present disclosure further relates to an integrated circuit made of semiconductor devices as mentioned above.

FIG. 1 illustrates an exemplary nano-heat sink approach implemented for a FinFET diode in accordance with an embodiment of the present disclosure. As shown in FIG. 1, nano-heat sink approach implemented for a FinFET Diode is depicted in (c) cross-sectional view of the proposed device along (a) X-X' plane and (b) Y-Y' plane, wherein the heat sink 102 is attached to a dummy metal gate 104 that is terminated to the surface of the chip.

In an embodiment, FIG. 1 shows a schematic view of the proposed diode FinFET with a dummy gate 104 (also referred to as dummy metal gate 104) that isolates anode (P+) and cathode (N+) regions. Localized/local heat sink 102 can be deployed over metal that connects multiple dummy gates over an inactive area, which helps in transporting heat from hot spot, via dummy gate, to nano-heat sink, which eventually takes heat out to the surface of the chip. Although the anode and cathode terminals can be used to dispose the heat, effective sub-fin area beneath these regions is approximately 10-20 times smaller as that provided by the dummy gate (as typically LAC=100-200 nm), which leads to better thermal coupling, and efficient heat dissipation through the dummy gate region.

Figure 2:
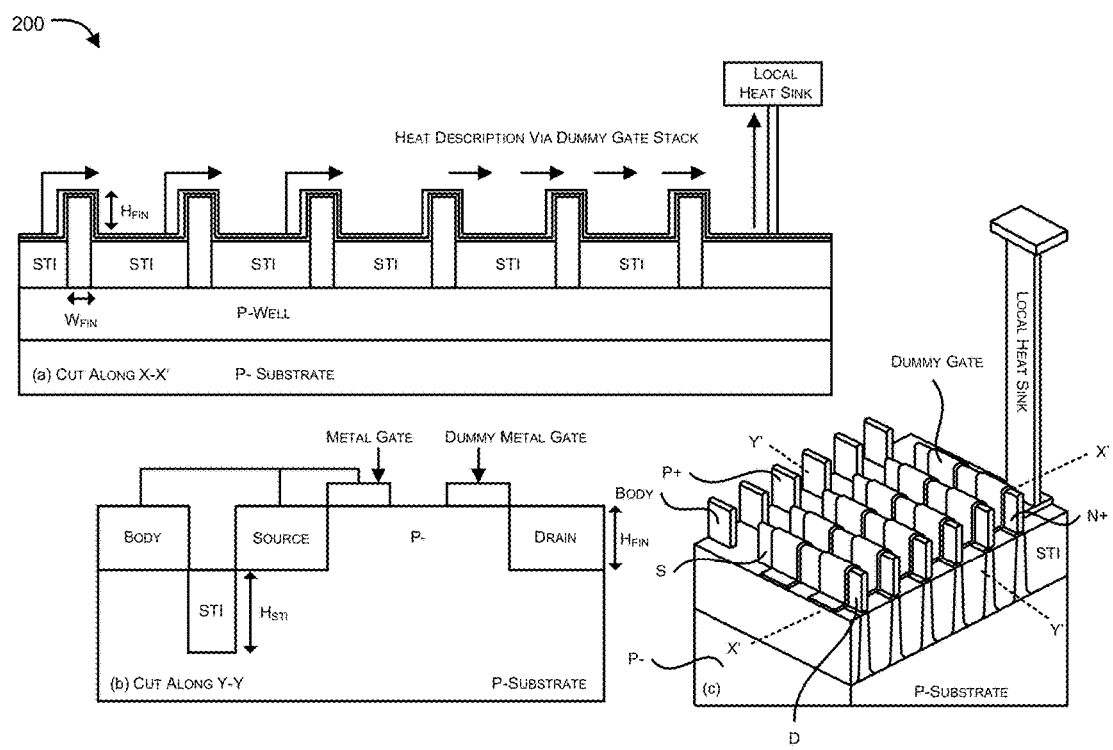
FIG. 2 shows proposed dual-gate grounded gate FinFET with nano-heat sink in accordance with an embodiment of the present disclosure.

FIG. 2 shows an exemplary embodiment of proposed nano-heat sink design configured in dual-gate grounded gate FinFET, wherein the proposed design comprises dual-gates, metal gate 202 and dummy metal gate 204, wherein (c) shows the cross-sectional view of the proposed device along (a) X-X' plane and (b) Y-Y' plane. In this embodiment, the local heat sink 206 can be attached to the dummy metal gate 204, which terminates to the surface of the chip. As would be appreciated, in comparison with embodiment of FIG. 1 that comprises n-type cathode and p-type anode disposed over a n-type well, FIG. 2 comprises p-type well and disposes the n-type source and the n-type drain over p-type well, which in turn is disposed over p-type substrate.

Figure 3:
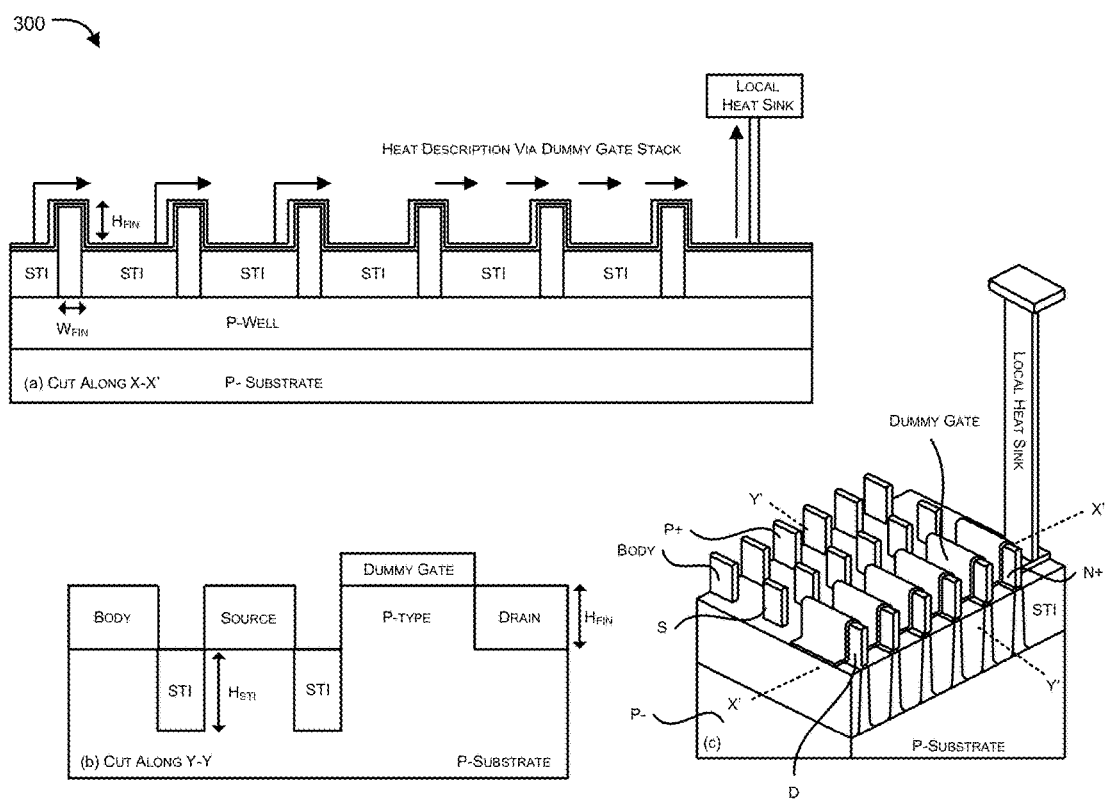
FIG. 3 shows 3D view of proposed Fin-BJT with nano-heat sink in accordance with an embodiment of the present disclosure.

FIG. 3 another exemplary 3D view embodiment of the proposed Fin-BJT in accordance with an embodiment of the present disclosure, wherein the 3D view of proposed Fin-BJT is depicted in (c) along with its X-sectional view along (a) X-X' and (b) Y-Y' with nano-heat sink.

Figure 7:
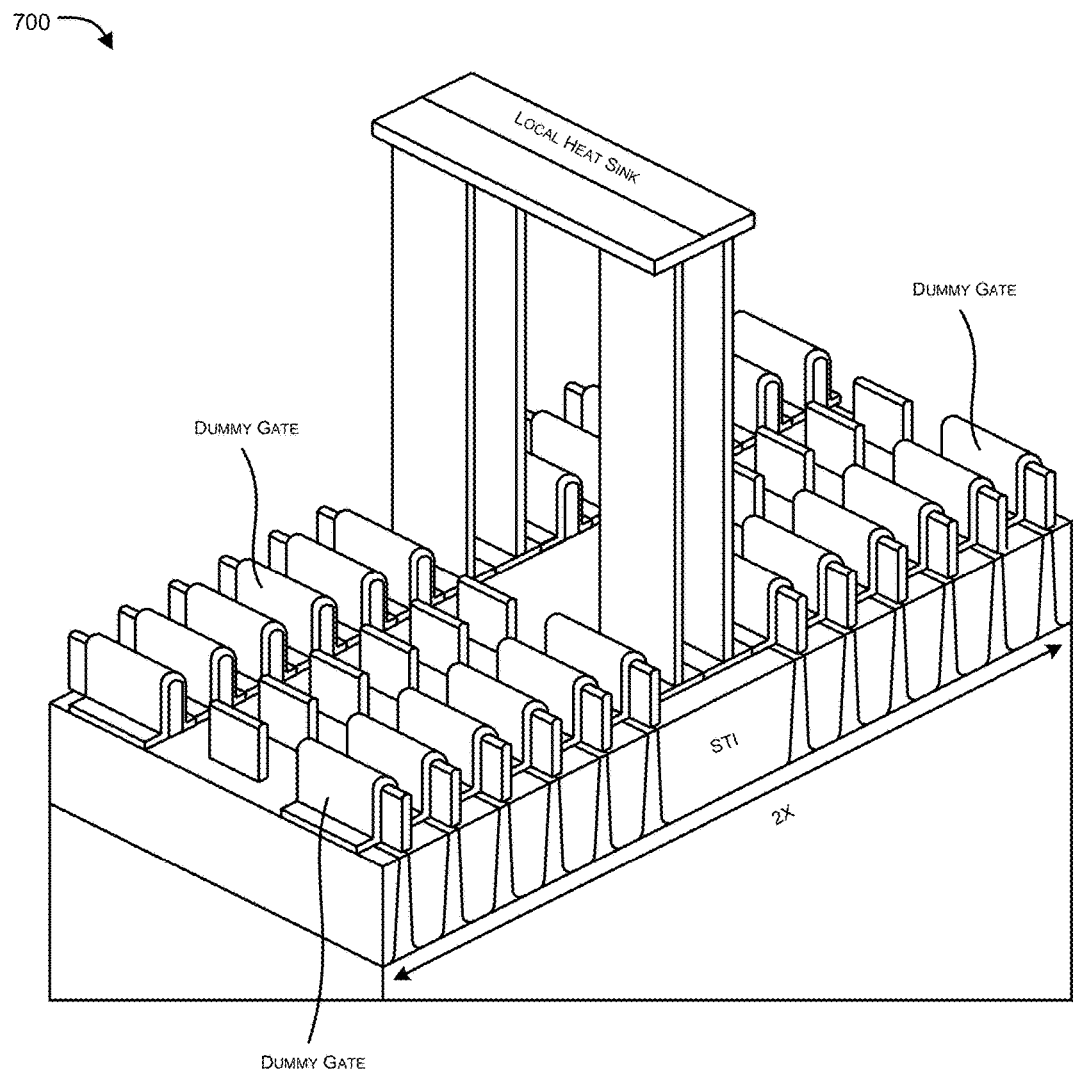
FIG. 7 illustrates the proposed scheme in a multi-fin configuration in accordance with an embodiment of the present disclosure.

As shown in FIGS. 1-3, dummy metal gates can be used as implant blocking masks over the fin, and can be used in areas next to the hot spot. Such dummy metal gates can be electrically (and hence thermally) connected/shorted together to offer thermal coupling. Furthermore, such a connection, using gate metal, can be terminated over STI that is adjacent to a group of fins (each group having >5 number of fins, as shown in FIG. 7). FIG. 7 illustrates the proposed scheme in a multi-fin configuration in accordance with an embodiment of the present disclosure.

In an aspect, thermal path terminated over STI can be connected with backend metallization, which acts as a heat sink and takes heat out to the chip surface. In an aspect, the proposed scheme can be implemented in architectures where dummy metal gate can be deployed next to hot spots (i.e., designs where dummy gates can be used as a spacer/blocking layer). Moreover, the proposed scheme can be deployed to ESD like larger electrical width device geometries and/or can be deployed to high power devices on chip, which require much larger device widths when compared to core devices.

Figure 4:
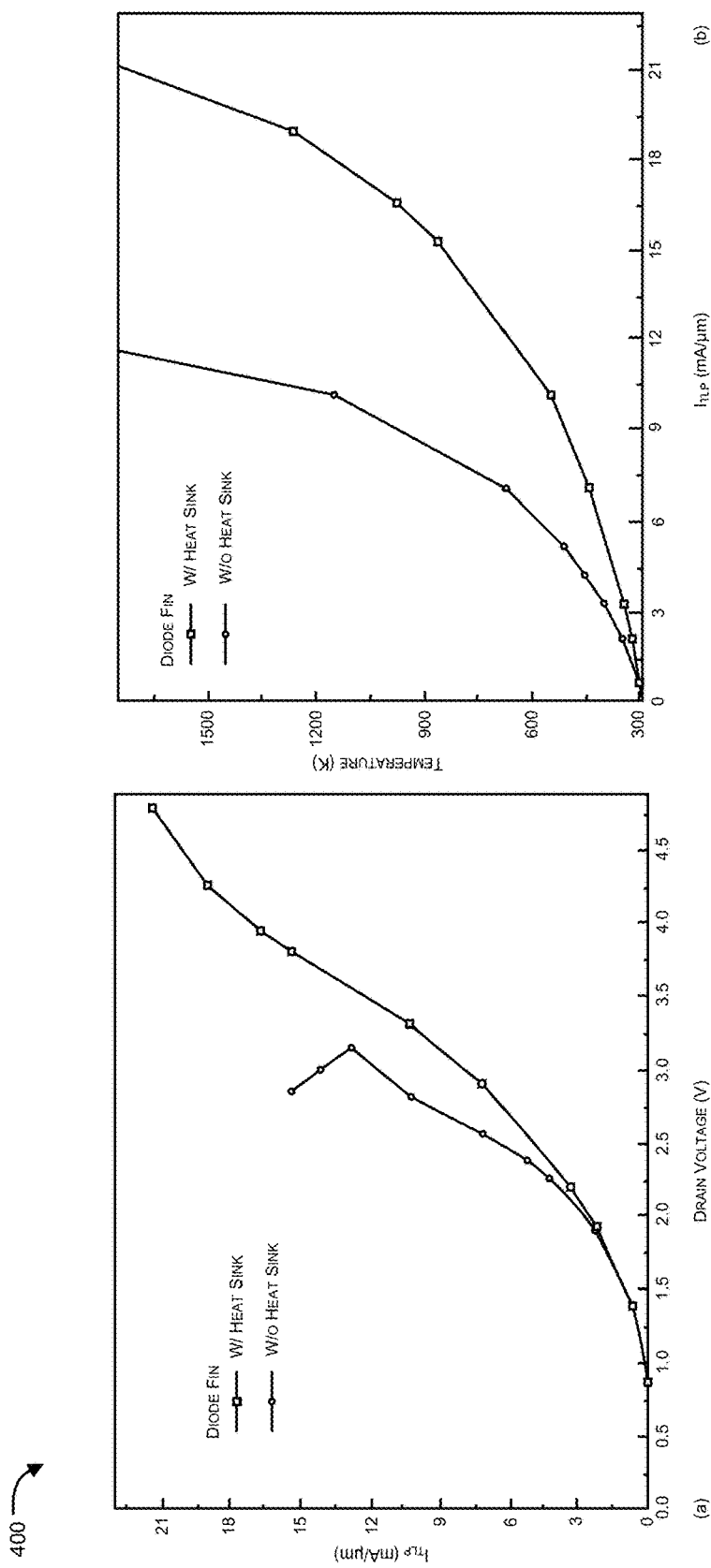
FIG. 4 shows (a) TLP IV characteristics and (b) lattice temperature with TLP stress of a Fin-Diode (shown in FIG. 1) with and without nano-heat sink. Figure depicts relaxed self-heating when nano-heat sink/dummy gate were deployed in accordance with an embodiment of the present disclosure.

FIG. 4 shows (a) TLP IV characteristics and (b) lattice temperature with TLP stress of a Fin-Diode (shown in FIG. 1) with and without nano-heat sink, wherein the figure depicts relaxed self-heating when nano-heat sink/dummy gate were deployed in accordance with an embodiment of the present disclosure.

Figure 5:
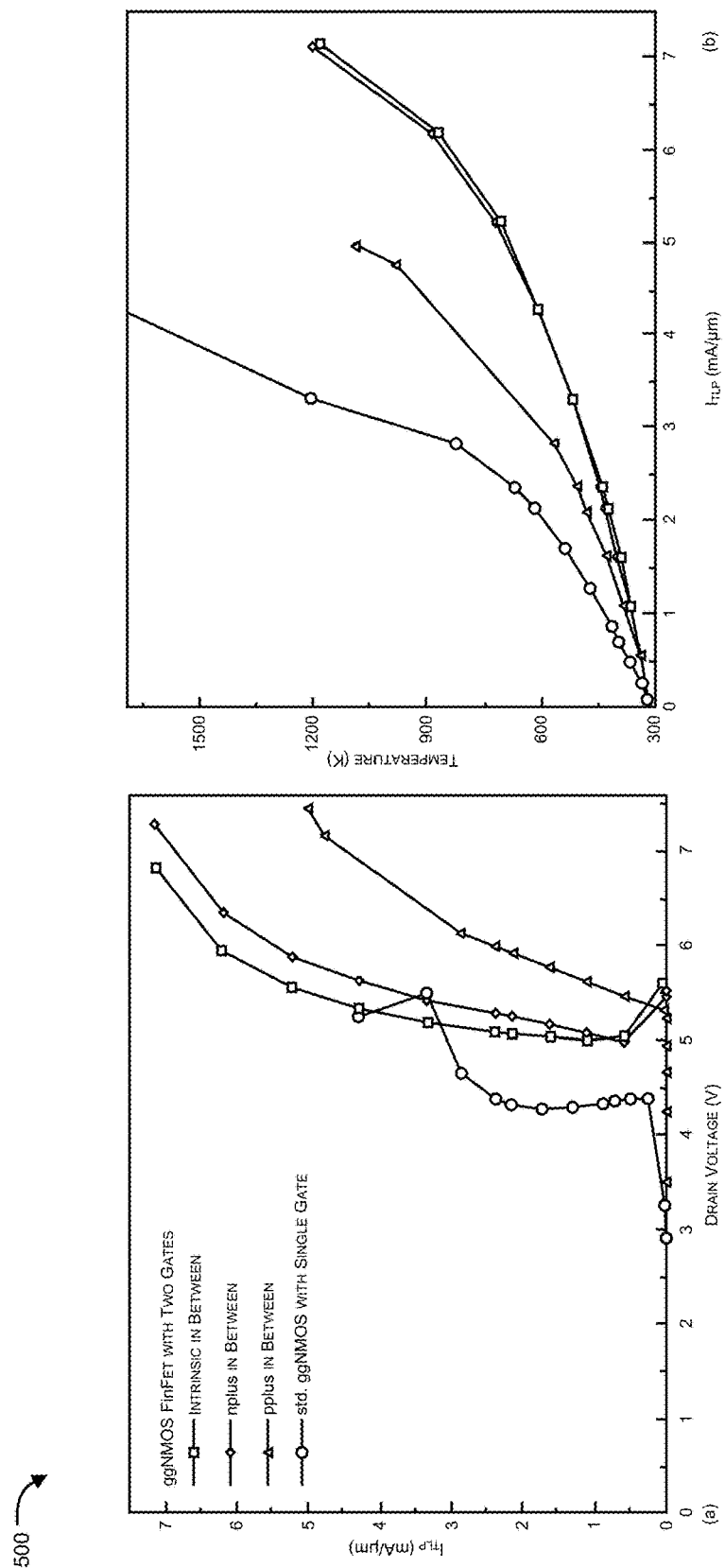
FIG. 5 shows (a) TLP IV characteristics and (b) lattice temperature with ESD stress extracted for proposed dual gate grounded FinFET device (shown in FIG. 2) in different configurations with nano-heat sink and it's comparison with grounded gate FinFET device without nano-heat sink in accordance with an embodiment of the present disclosure.

FIG. 5 shows (a) TLP IV characteristics and (b) lattice temperature with ESD stress extracted for proposed dual gate grounded FinFET device (shown in FIG. 2) in different configurations with nano-heat sink and its comparison with grounded gate FinFET device without nano-heat sink in accordance with an embodiment of the present disclosure.

Figure 6:
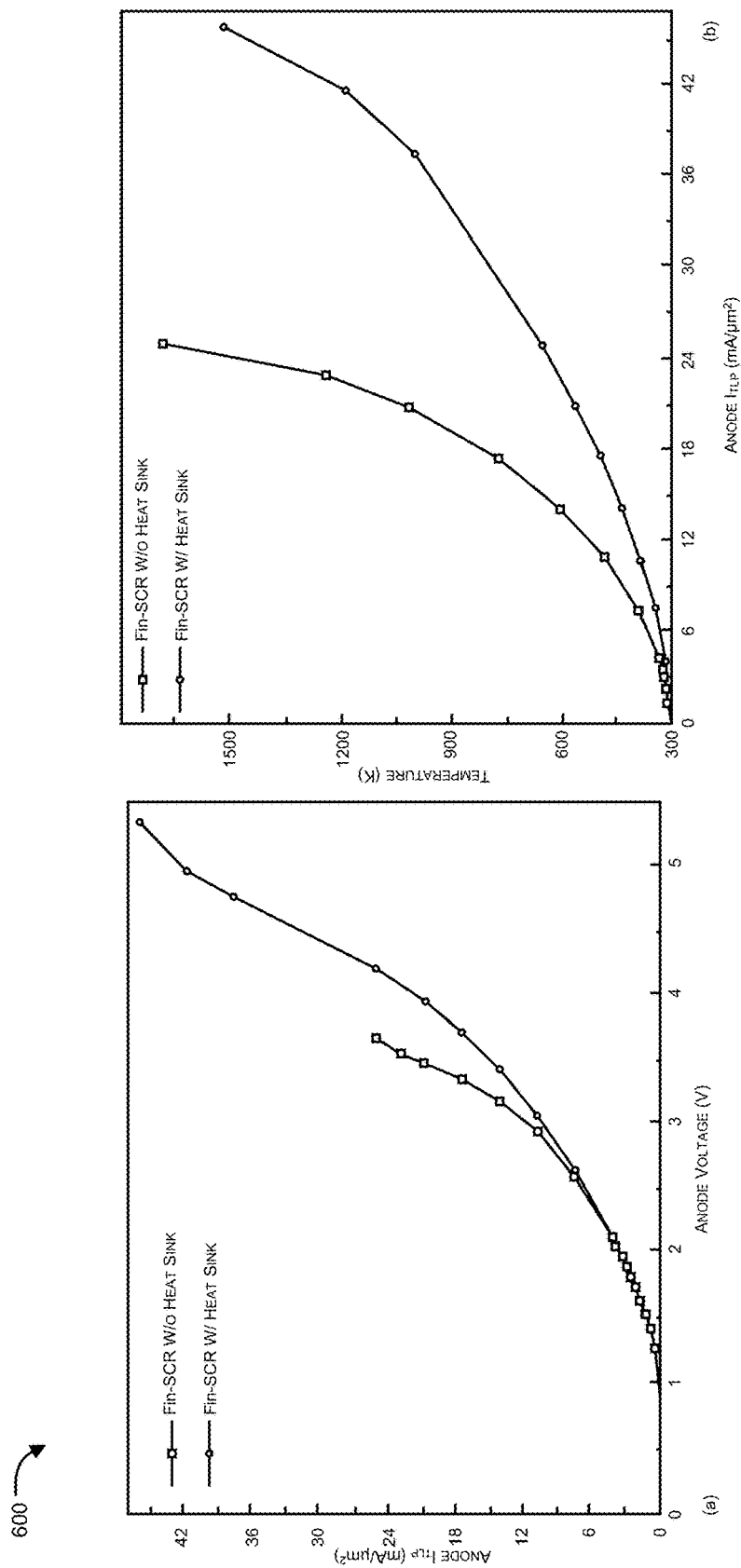
FIG. 6 illustrates (a) TLP IV characteristics and (b) lattice temperature extracted for a FinFET Gated SCR, with and without local heat sink in accordance with an embodiment of the present disclosure.

FIG. 6 illustrates (a) TLP IV characteristics and (b) lattice temperature extracted for a FinFET Gated SCR with and without local heat sink in accordance with an embodiment of the present disclosure.

As shown, FIGS. 4-6 depict significant advantage offered by the proposed scheme, wherein failure current improves by 90%-120% without changing the characteristics, which can reduce area covered by ESD protection devices to its half, thereby enabling saving of 15% of the overall chip area.

FIG. 7, as explained above, illustrates an embodiment of the proposed scheme/design having dummy gates that are operatively coupled with a local heat sink configured in a multi-fin configuration.

Figure 8:
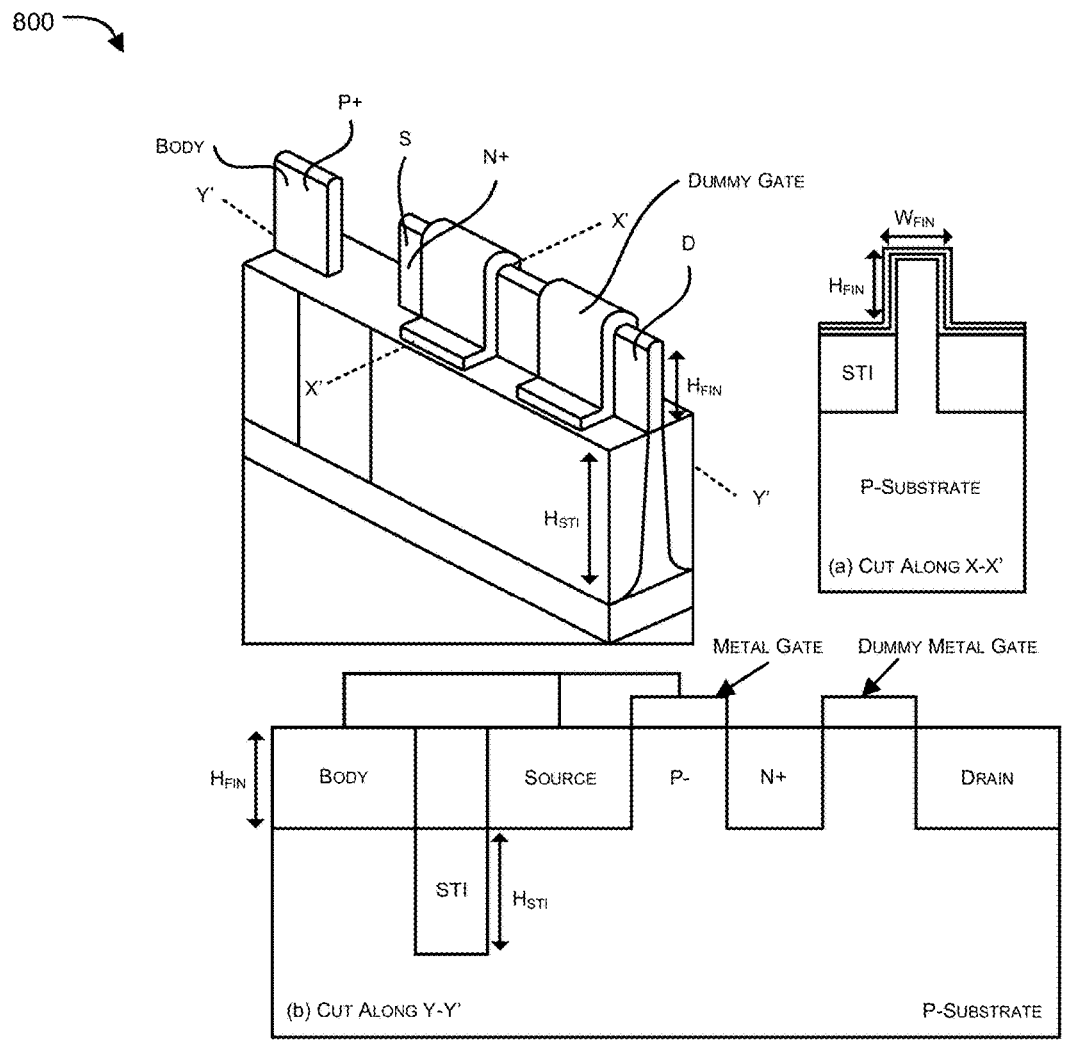
FIG. 8 illustrates device shown in FIG. 2 where region between gates is N+ type, with its (a) cross-section shown along X-X' and (b) Y-Y' in accordance with an embodiment of the present disclosure.

FIG. 8 illustrates the device shown in FIG. 2, where the region between the gates is N+ type, with its (a) cross-section shown along X-X' and (b) Y-Y', in accordance with an embodiment of the present disclosure.

Figure 9:
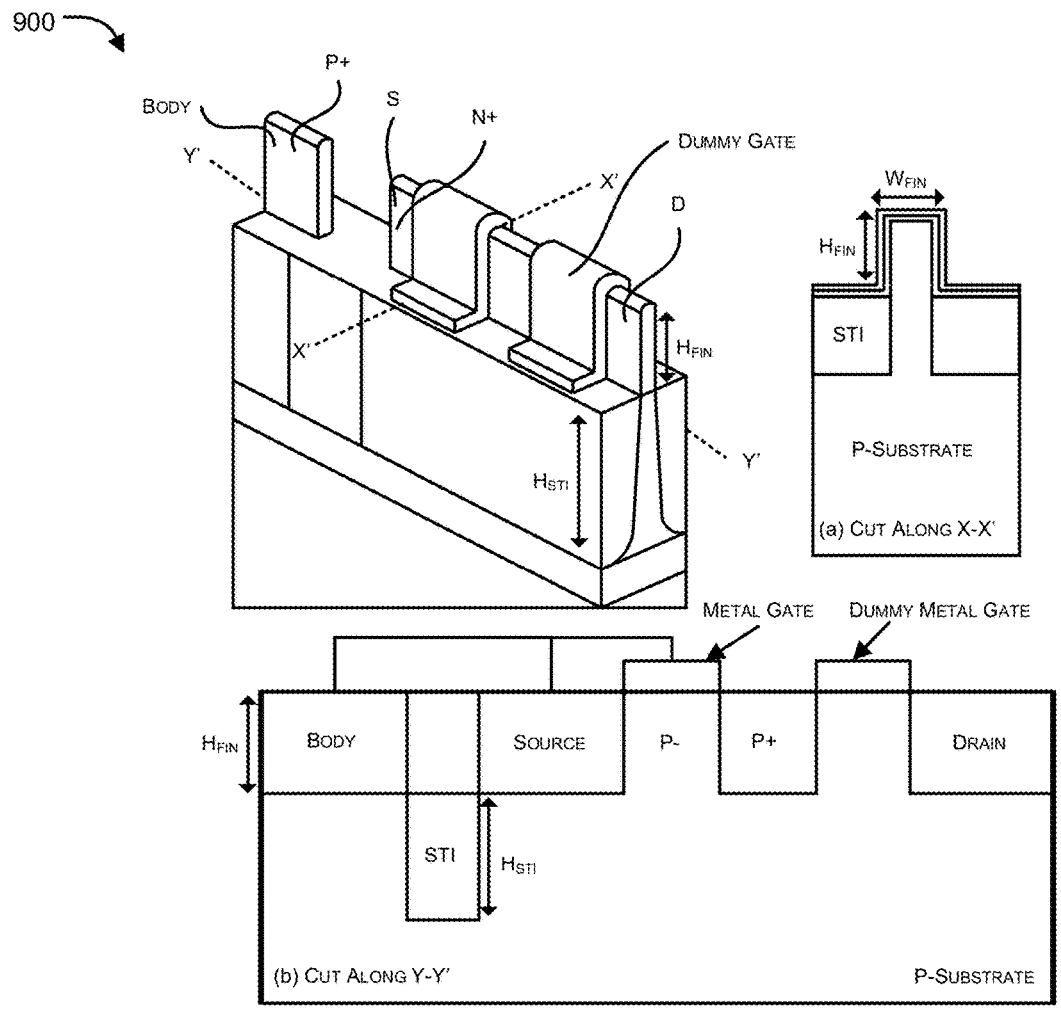
FIG. 9 illustrates device shown in FIG. 2 where region between gates is P+ type, with its (a) cross-section shown along X-X' and (b) Y-Y' in accordance with an embodiment of the present disclosure.

FIG. 9 illustrates the device shown in FIG. 2 where region between the gates is P+ type with its (a) cross-section shown along X-X' and (b) Y-Y' in accordance with an embodiment of the present disclosure.

Figure 10:
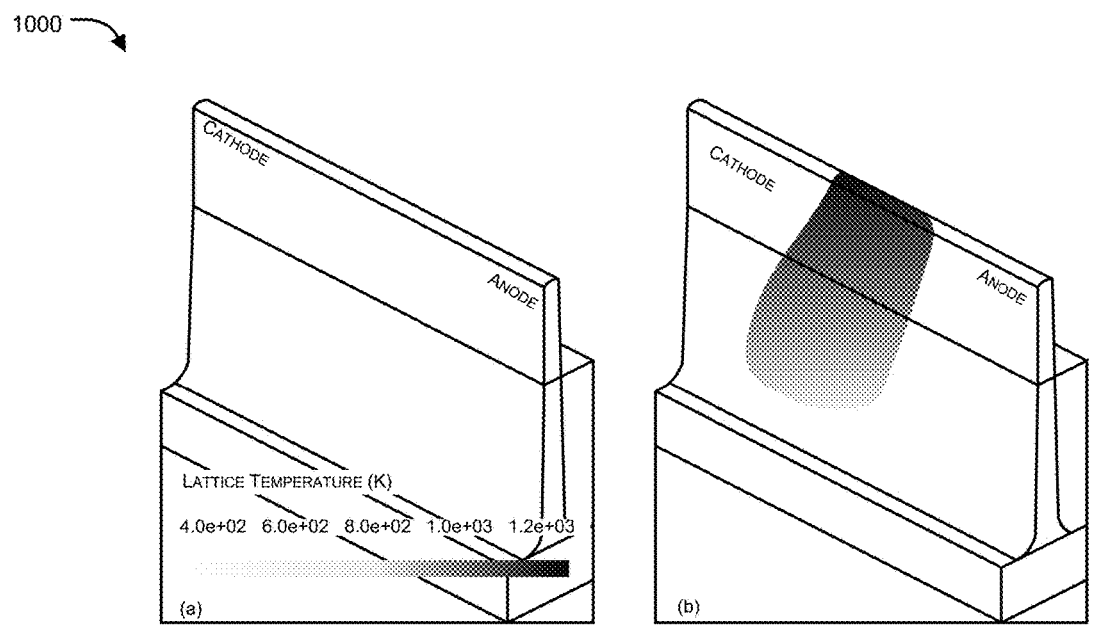
FIG. 10 illustrates exemplary lattice temperature distribution profile of Diode FinFET, (a) with localized heat sink, and (b) without localized heat sink.

FIG. 10 illustrates lattice temperature distribution profile of Diode FinFET (a) with localized heat sink and (b) without localized heat sink. Fin-Diode with heat sink exhibits relaxed self-heating compared to the prior art device in accordance with an embodiment of the present disclosure.

Figure 11:
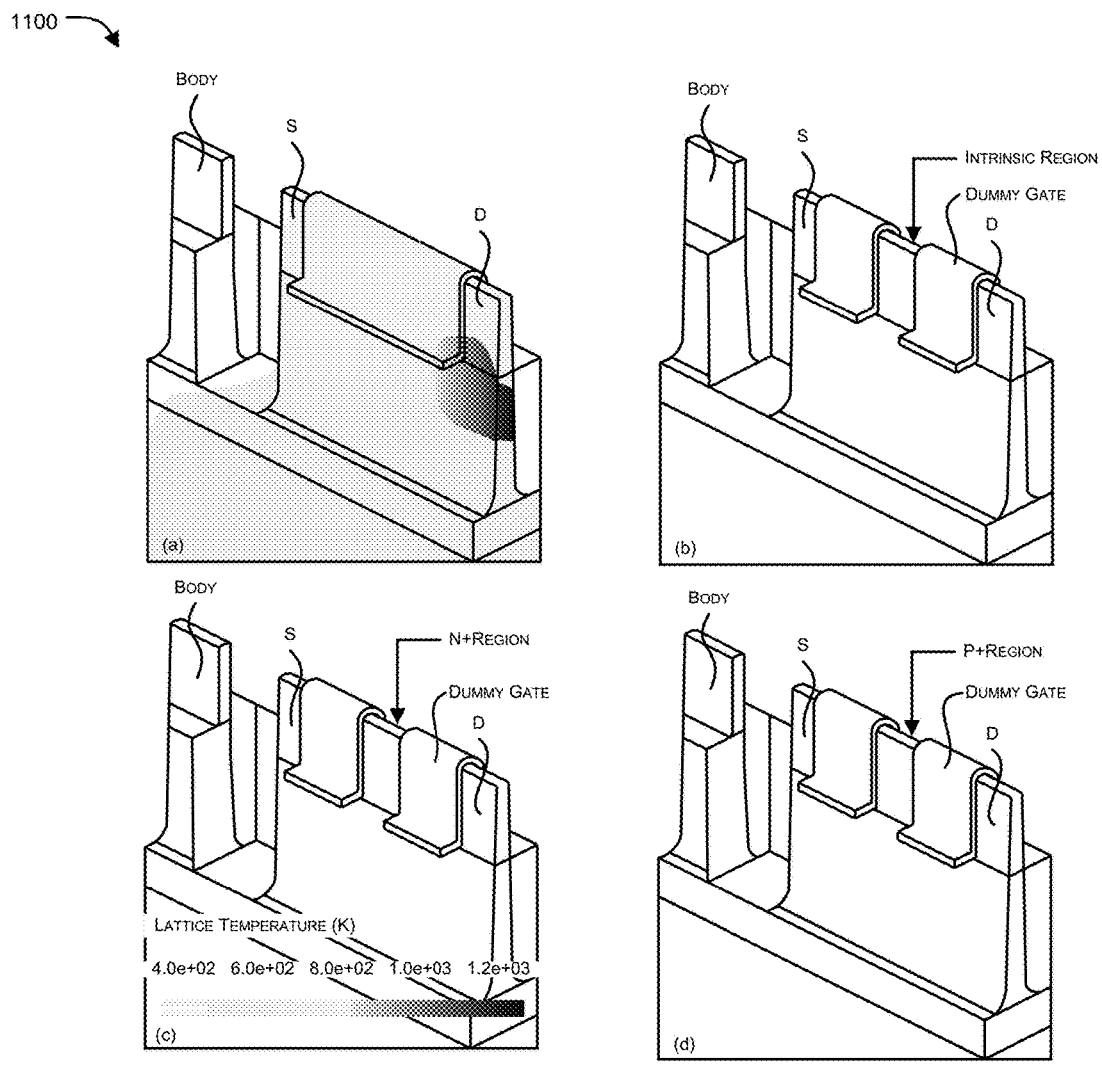
FIG. 11 illustrates exemplary lattice temperature distribution of dummy gated ggFinFET [for (b) device in FIG. 2; (c) device in FIG. 8; (d) device in FIG. 9], and its comparison with prior-art ggFinFET (a). The device designs with a dummy gate deployed near a hot spot (b, c, d), display lower self-heating, and thereby substantiates effectiveness of proposed scheme for non-planar technologies in accordance with an embodiment of the present disclosure.

FIG. 11 illustrates lattice temperature distribution of dummy gated ggFinFET [for (b) device in FIG. 2; (c) device in FIG. 8; (d) device in FIG. 9], and its comparison with the prior-art ggFinFET (a). The device designs with a dummy gate deployed near a hot spot (b, c, d) displayed lower self-heating, thereby substantiating effectiveness of the proposed scheme for non-planar technologies in accordance with an embodiment of the present disclosure.

Figure 12:
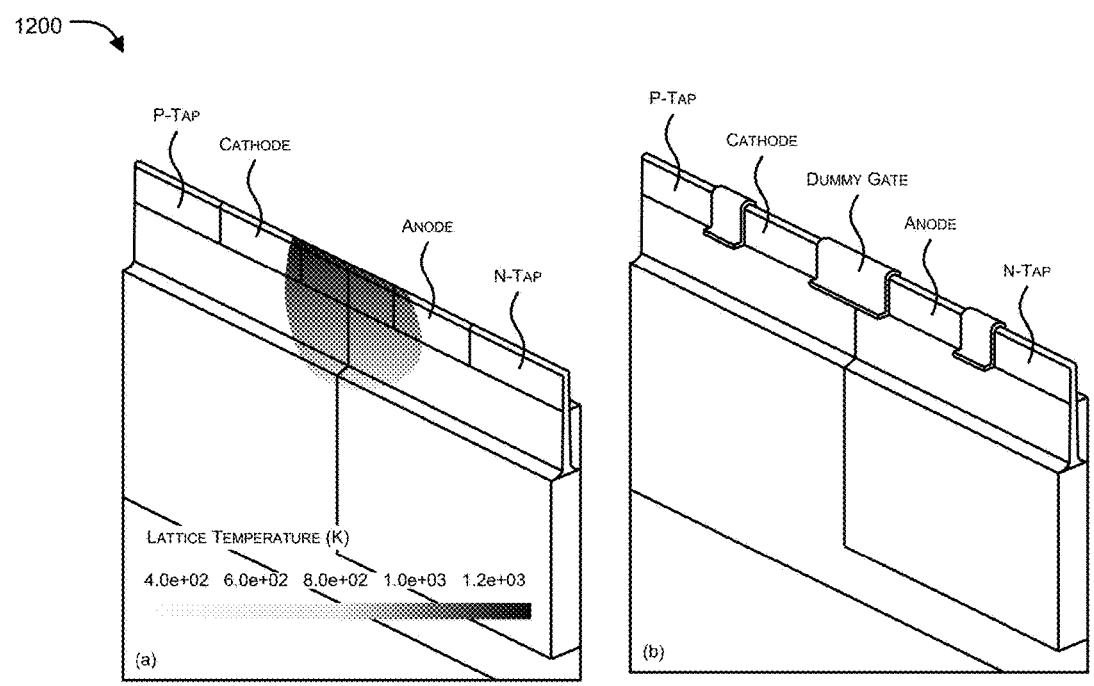
FIG. 12 illustrates exemplary lattice temperature distribution profile of SCR FinFET, (a) without, and (b) with localized heat sink.

FIG. 12 illustrates lattice temperature distribution profile of SCR FinFET (a) without, and (b) with localized heat sink, wherein the dummy gates help mitigate self-heating, which results in higher failure thresholds in accordance with an embodiment of the present disclosure.

In an embodiment, the proposed concept is independent of the device type, as depicted in FIGS. 4-6 and FIGS. 10-12, wherein FIGS. 4-6 and FIGS. 10-12 show TLP IV characteristics and lattice temperature contours of various ESD protection devices (Diode, ggNMOS, BJT and SCR), with and without proposed scheme, respectively. The proposed device and solution offers 90% improvement in failure current for Diode FinFETs, 130% improvement for ggFinFETs; thereby enhancing product reliability and life expectancy, which eventually saves 50% ESD protection area for a given robustness level, thereby lowers the chip cost by at least 15%.

The present disclosure relates to non-planar ESD protection devices with nano heat sink(s). In an aspect, the present disclosure provides a thermal management solution for ESD protection devices in advanced Fin- and/or Nanowire-based technology nodes by employing localized nano heat sinks, which leverages heat transport from local hot spots to the surface of the chip, which allows significant reduction in peak temperature for a given ESD current. From ESD robustness point of view, the proposed solution offers ~50% improvement in failure current, thereby enhancing product reliability, life expectancy. This also saves 50% ESD protection area, lowers capacitive loading on the I/O pads for a given robustness level and eventually can lower the chip cost by at least 15%.

In another aspect, the present disclosure provides non-planar ESD protection devices with nano heat sinks that use (i) dummy gate—next to hot spot(s) in place of implant blocking layer(s)/diffusion isolation layer(s), (ii) by providing an electrical coupling using metal (and hence thermal coupling) to these dummy gates and (iii) deploying a localized nano-heat sink over a region where the metal coupling a group of these dummy gate(s) terminates, which leverages heat transport from local hot spots, through dummy gate and the metal coupling them, to the surface of the chip.

In an aspect, the present disclosure provides a 3D semiconductor device that includes an array of semiconducting fins isolated by shallow trench isolation (STI) between them, which extends from p-type anode via an intrinsic region to n-type cathode, and is disposed over a n-type or p-type well inside a substrate; an electrically floating dummy gate stack deposited over the intrinsic region of all Fins in the array and gets terminated over the extended STI at the end of the array; and a nano-heat sink that, using back end metallization, is disposed over the gate stack metal terminated over STI. In an implementation, the intrinsic Fin region of 3D devices can be n-type or p-type doped.

In an exemplary implementation, hot spots formed in intrinsic region under ESD stress condition are thermally connected by dummy gates, where heat energy flows from the hot spots, via the dummy gates, to the nano-heat sink, which takes it out to the surface of the chip.

In another aspect, the present disclosure provides a 3D semiconductor device that includes an array of semiconducting fins isolated by STI between them, which extends from N-type source, via an intrinsic region, to N-type drain, and disposed over a P-type well in a substrate; a dummy gate stack that is deposited over the drain side of the intrinsic region of all fins in the array and is terminated over extended STI at the end of the array; a gate stack that is deposited over the source side of the intrinsic region of all fins in the array and gets terminated over the extended STI at the end of the array; wherein a gate stack that is deposited over the source side offers MOSFET operation, whereas the gate stack deposited at the drain side is electrically floating. Drain side gate and source side gate are physically isolated, wherein the Fin region beneath their physical isolation can be intrinsic, N-type or P-type doped. The semiconductor device can further include a nano-heat sink that, using back end metallization, is disposed over the dummy gate stack metal which terminates over STI. In an implementation, intrinsic Fin region of 3D devices can be n-type or p-type doped.

In another aspect, the present disclosure provides a 3D semiconductor device that includes an array of semiconducting fins isolated by shallow trench isolation between them, which extends from p-type source via an intrinsic region to p-type drain, and is disposed over a n-type well in a substrate. The semiconductor device can further include a dummy gate stack that is deposited over the drain side of the intrinsic region of all fins in the array and gets terminated over the extended STI at the end of the array. The semiconductor device can further include a gate stack that is deposited over the source side of the intrinsic region of all fins in the array and gets terminated over the extended STI at the end of the array, wherein gate stack that is deposited over the source side offers MOSFET operation, whereas the gate stack deposited at the drain side is electrically floating, and wherein drain side gate and source side gate are physically isolated where the Fin region beneath their physical isolation can be intrinsic, N-type, or P-type doped. The proposed semiconductor device can further include a nano-heat sink that, using back end metallization, is disposed over the dummy gate stack metal which is terminated over STI. In an implementation, the intrinsic Fin region of 3D devices can be n-type or p-type doped.

In another aspect, the present disclosure provides a 3D semiconductor device that includes an array of semiconducting fins that are isolated by shallow trench isolation between them, which extends from N-type emitter, via an intrinsic region, to N-type collector, and is disposed over a P-type well in a substrate, wherein-type emitter is physically isolated from intrinsic fin via a shallow trench isolation. The proposed semiconductor device can further include a gate stack that is deposited over the intrinsic region next to the n-type collector; and a nano-heat sink that, using back end metallization, is disposed over the dummy gate stack metal terminated over STI. In an implementation, the intrinsic fin region of 3D devices can be n-type or p-type doped.

In another aspect, the present disclosure provides a 3D semiconductor device that includes an array of semiconducting fins that are isolated by shallow trench isolation between them, which extends from p-type emitter, via an intrinsic region, to p-type collector, and is disposed over a n-type well in a substrate, wherein p-type emitter is physically isolated from intrinsic Fin via a shallow trench isolation. The proposed semiconductor device further includes a gate stack deposited over the intrinsic region next to the p-type collector, and a nano-heat sink that, using back end metallization, is disposed over the dummy gate stack metal terminated over STI. In an implementation, the intrinsic Fin region of 3D devices can be n-type or p-type doped. In an exemplary implementation, hot spots that are formed in intrinsic region under ESD stress condition are thermally connected by dummy gates, wherein heat energy flows from the hot spots, via the dummy gates, to nano-heat sink, which in turn takes the heat out to the surface of the chip.

In another aspect, the present disclosure further discloses a 3D semiconductor device that includes an array of semiconducting fins isolated by shallow trench isolation between them, which extends from p-type tap, via an n-type cathode and p-type anode, to an n-type tap, wherein the p-type tap and cathode are isolated by an intrinsic fin region or shallow trench isolation between them and are disposed over a p-type well in a substrate, and wherein the n-type tap and anode are isolated by an intrinsic Fin region or a shallow trench isolation between them and are disposed over a n-type well in a substrate. In such an implementation, the anode and cathode can be isolated by an intrinsic region, wherein an electrically floating dummy gate stack can be deposited over the intrinsic region between anode and cathode of all the fins in the array so as to get terminated over the extended STI at the end of the array. The proposed semiconductor device can further include a nano-heat sink that, using back end metallization, is disposed over the dummy gate stack metal terminated over STI. In an exemplary implementation, hot spots formed in intrinsic region under ESD stress condition are thermally connected by dummy gates, wherein heat energy flows from the hot spots, via the dummy gates, to nano-heat sink that takes it out to the surface of the chip.

In an exemplary implementation, 3D structures can be repeated in X and Y directions so as to create devices with larger electrical widths. In another exemplary implementation, 3D devices can further include guard-rings.

In exemplary implementation, substrate in the proposed 3D devices can be a semiconductor or an insulator or a stack of two. In exemplary implementation, fin in the proposed 3D devices can be made of a Nanowire or an array of Nanowires on top of each other. The fin can include, without any limitation, Si, SiGe, and Ge, materials belonging to III-V or III-Nitride groups, transition metal dichalcogenides or other 2-Dimensional semiconductors.

In exemplary implementation, the proposed 3D devices can be incorporated in an integrated circuit.

While the foregoing describes various embodiments of the invention, other and further embodiments of the invention may be devised without departing from the basic scope thereof. The scope of the invention is determined by the claims that follow. The invention is not limited to the described embodiments, versions or examples, which are included to enable a person having ordinary skill in the art to make and use the invention when combined with information and knowledge available to the person having ordinary skill in the art.

ADVANTAGES OF THE INVENTION

The present disclosure provides a semiconductor device that reduces self-heating across ESD protection devices in non-planar technologies.

The present disclosure provides a semiconductor device that improves failure current.

The present disclosure provides a semiconductor device that enhances product reliability and life expectancy.

The present disclosure provides a semiconductor device that saves ESD protection area for a given robustness level resulting in lowered chip cost.

The present disclosure provides a thermal management solution for non-planar technologies that can be configured in or incorporated by semiconductor devices.

We claim:

1. A semiconductor device comprising:
   at least one fin;
   a dummy metal gate disposed over at least a portion of the at least one fin,
   wherein the dummy metal gate is used as an implant blocking mask over the at least one fin and is used in areas that generate heat; and
   a nano-heat sink operatively coupled with the dummy metal gate and terminating at the surface of a chip in which the semiconductor device is configured so as to enable transfer of heat received from the at least one fin through the dummy metal gate to the surface of the chip.

2. The semiconductor device of claim 1, wherein the dummy metal gate isolates anode and cathode regions of the at least one fin.

3. The semiconductor device of claim 1, wherein the semiconductor device comprises a plurality of dummy metal gates that are connected to a metal pad at its one first end, and wherein at its second end, the metal is connected to the nano-heat sink.

4. The semiconductor device of claim 1, wherein the semiconductor device is a dual-gate FinFET comprising an electrical metal gate that is operatively coupled with the floating dummy metal gate.

5. The semiconductor device of claim 1, wherein the at least one fin comprises n-type cathode and p-type anode disposed over a n-type well disposed over a p-type substrate.

6. The semiconductor device of claim 1, wherein the at least one fin comprises n-type cathode and p-type anode over p-type well that is disposed over p-type substrate.

7. The semiconductor device of claim 1, wherein the semiconductor device is any or a combination of a SCR FinFET, FinFET diode, ggFinFET, and a FinBJT.

8. The semiconductor device of claim 1, wherein the dummy metal gate terminates over an extended shallow trench isolation (STI) that is adjacent to the at least one fin.

9. The semiconductor device of claim 1, wherein a plurality dummy metal gates are configured, each gate of the plurality dummy metal gates being configured on a fin that is selected from a plurality of fins which form part of the semiconductor device.

10. The semiconductor device of claim 1, wherein a plurality dummy metal gates are configured on the at least one fin, and wherein region between the plurality dummy metal gates and the electrical gates can be either N+ type, P+ type or intrinsic.

11. The semiconductor device of claim 1, wherein the at least one fin comprises an array of fins that are isolated by shallow trench isolation (STI) that extends from p-type anode, via an intrinsic region, to n-type cathode, wherein the dummy metal stack is deposited over intrinsic region of the array of fins and gets terminated over an extended STI at the end of the array and wherein the intrinsic region is any of n-type or p-type doped.

12. The semiconductor device of claim 1,
wherein the at least one fin comprises an array of fins that are isolated by shallow trench isolation (STI) that extends from N-type source, via an intrinsic region, to N-type drain, disposed over p-type well in a substrate, wherein an electrical gate stack is deposited over the intrinsic region near the source side of the array of fins, and gets terminated over an extended STI at the end of the array,
wherein the dummy metal stack is deposited over intrinsic region near the drain side of the array of fins and gets terminated over an extended STI at the end of the array, and
wherein the intrinsic region is any of n-type or p-type doped.

13. The semiconductor device of claim 1,
wherein the at least one fin comprises an array of fins that are isolated by shallow trench isolation (STI) that extends from P-type source, via an intrinsic region, to P-type drain, disposed over n-type well in a substrate,
wherein an electrical gate stack is deposited over the intrinsic region near the source side of the array of fins, and gets terminated over an extended STI at the end of the array, and
wherein the dummy metal stack is deposited over intrinsic region near the drain side of the array of fins and gets terminated over an extended STI at the end of the array and wherein the intrinsic region is any of n-type or p-type doped.

14. The semiconductor device of claim 1,
wherein the at least one fin comprises an array of fins that are isolated by shallow trench isolation (STI) that extends from N-type emitter, via an intrinsic region, to N-type collector, disposed over a p-type well,
wherein the N-type emitter is physically isolated from the intrinsic fin region via STI, and
wherein the dummy metal stack is deposited over intrinsic region of the array of fins next to the N-type collector, and gets terminated over an extended STI at the end of the array and wherein the intrinsic region is any of n-type or p-type doped.

15. The semiconductor device of claim 1,
wherein the at least one fin comprises an array of fins that are isolated by shallow trench isolation (STI) that extends from P-type emitter, via an intrinsic region, to P-type collector, disposed over a n-type well,
wherein the P-type emitter is physically isolated from the intrinsic fin region via STI, and wherein the dummy metal stack is deposited over intrinsic region of the array of fins next to the P-type collector, and gets terminated over an extended STI at the end of the array, and
wherein the intrinsic region is any of n-type or p-type doped.

16. The semiconductor device of claim 1,
wherein the at least one fin comprises an array of fins that are isolated by shallow trench isolation (STI) that extends from P-type tap, via an n-type cathode and p-type anode, to an N-type tap,
wherein the p-type tap and the cathode are isolated by an intrinsic fin region or shallow trench isolation between them and are disposed over a p-type well in a substrate,
wherein the n-type tap and the anode are isolated by an intrinsic Fin region or a shallow trench isolation between them and are disposed over a n-type well in the substrate,
wherein the electrically floating dummy metal stack is deposited over intrinsic region between the anode and the cathode, and gets terminated over an extended STI at the end of the array, and
wherein the intrinsic region is any of n-type or p-type doped.

17. The semiconductor device of claim 1, wherein substrate of the device pertains to any or a combination of a semiconductor, an insulator, and a stack of the semiconductor and insulator.

18. The semiconductor device of claim 1, wherein hot spots are formed in intrinsic region under ESD stress condition such that heat flows from the hot spots via the dummy metal gate to the nano heat sink.

19. The semiconductor device of claim 1, wherein 3D structure of the semiconductor device is repeated in X and Y directions so as to create devices with larger electrical widths.

20. The semiconductor device of claim 1, wherein the semiconductor device comprises guard-rings.

21. The semiconductor device of claim 1, wherein the at least one fin is made of nanowire or an array of nanowires on top of each other.

22. The semiconductor device of claim 1, wherein the at least one fin is made of any or a combination of Si, SiGe, and Ge, materials belonging to III-V or III-Nitride groups, transition metal dichalcogenides or other 2-Dimensional semiconductors.

23. An integrated circuit made of one or more of the semiconductor device of claim 1.

* * * * *